United States Patent
Hung et al.

(10) Patent No.: US 9,396,953 B2
(45) Date of Patent: Jul. 19, 2016

(54) CONFORMITY CONTROL FOR METAL GATE STACK

(71) Applicant: Taiwan Semiconductor Manufacturing Company, Ltd., Hsin-Chu (TW)

(72) Inventors: Chi-Cheng Hung, Tainan (TW); Kuan-Ting Liu, Hsin-Chu (TW); Yu-Sheng Wang, Tainan (TW); Ching-Hwanq Su, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/213,395

(22) Filed: Mar. 14, 2014

(65) Prior Publication Data
US 2015/0262823 A1 Sep. 17, 2015

(51) Int. Cl.
*H01L 21/285* (2006.01)
*H01L 21/3105* (2006.01)
*H01L 21/28* (2006.01)
*H01L 29/423* (2006.01)
*H01L 29/78* (2006.01)
*H01L 29/66* (2006.01)
*H01L 29/49* (2006.01)
*H01L 29/165* (2006.01)

(52) U.S. Cl.
CPC ...... *H01L 21/2855* (2013.01); *H01L 21/28088* (2013.01); *H01L 29/165* (2013.01); *H01L 29/4966* (2013.01); *H01L 29/66545* (2013.01); *H01L 29/66636* (2013.01); *H01L 29/7834* (2013.01); *H01L 29/7848* (2013.01); *H01L 29/6656* (2013.01); *H01L 29/6659* (2013.01)

(58) Field of Classification Search
None
See application file for complete search history.

(56) References Cited

U.S. PATENT DOCUMENTS

| | | | |
|---|---|---|---|
| 8,933,507 B2 | 1/2015 | Ng et al. | |
| 2010/0252417 A1* | 10/2010 | Allen | C23C 14/345 204/192.12 |
| 2011/0140207 A1* | 6/2011 | Lin | H01L 21/28088 257/412 |
| 2011/0193162 A1* | 8/2011 | Chuang | H01L 29/41775 257/343 |
| 2011/0241130 A1* | 10/2011 | Chan | H01L 21/28079 257/410 |
| 2012/0306026 A1 | 12/2012 | Guo et al. | |
| 2013/0037865 A1* | 2/2013 | Nogami | H01L 21/823842 257/288 |
| 2015/0061041 A1* | 3/2015 | Lin | H01L 21/28088 257/410 |

FOREIGN PATENT DOCUMENTS

TW 201403829 1/2014

* cited by examiner

*Primary Examiner* — Michael Lebentritt
*Assistant Examiner* — Jordan Klein
(74) *Attorney, Agent, or Firm* — Slater Matsil, LLP

(57) ABSTRACT

A method includes forming a dummy gate stack over a semiconductor substrate, wherein the semiconductor substrate is comprised in a wafer. The method further includes removing the dummy gate stack to form a recess, forming a gate dielectric layer in the recess, and forming a metal layer in the recess. The metal layer is over the gate dielectric layer. The formation of the metal layer includes placing the wafer against a target, applying a DC power to the target, and applying an RF power to the target, wherein the DC power and the RF power are applied simultaneously. A remaining portion of the recess is then filled with metallic materials, wherein the metallic materials are overlying the metal layer.

20 Claims, 11 Drawing Sheets

CONFORMITY CONTROL FOR METAL GATE STACK

BACKGROUND

Metal-Oxide-Semiconductor (MOS) devices are basic building elements in integrated circuits. An existing MOS device typically has a gate electrode comprising polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
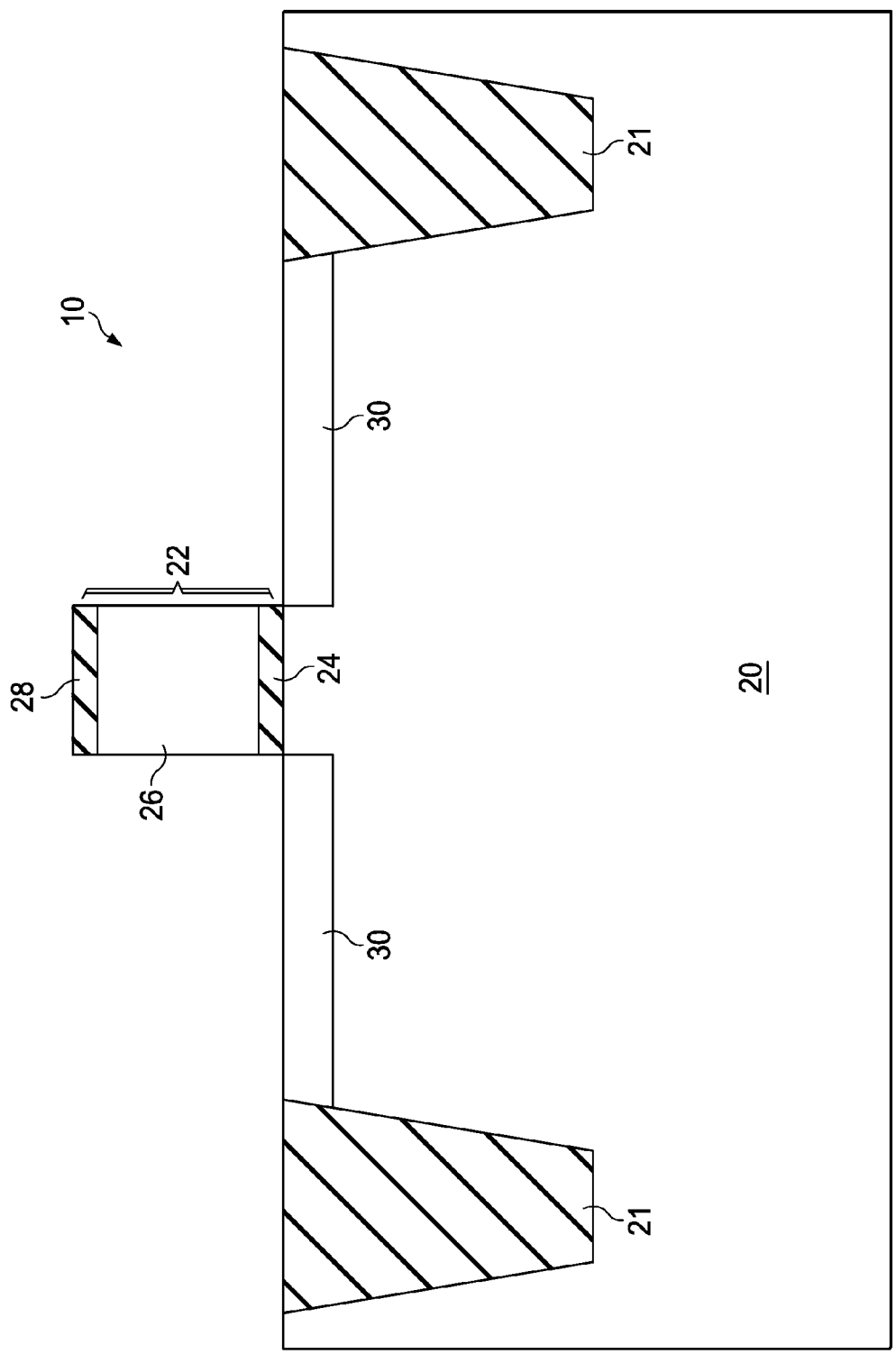
FIGS. 1 through 10 illustrate the cross-sectional views of intermediate stages in the formation of a Metal-Oxide-Semiconductor (MOS) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Metal-Oxide-Semiconductor (MOS) device and the method of forming the same are provided in accordance with various exemplary embodiments. The intermediate stages of forming the MOS device are illustrated. The variations of the embodiments are discussed. Throughout the various views and illustrative embodiments, like reference numbers are used to designate like elements.

FIGS. 1 through 10 are cross-sectional views of intermediate stages in the formation of a MOS device in accordance with some exemplary embodiments. Referring to FIG. 1, wafer 10, which comprises substrate 20, is provided. Substrate 20 may be formed of a semiconductor material such as silicon, silicon carbon (SiC), silicon germanium (SiGe), a III-V compound semiconductor, or the like. Shallow Trench Isolation (STI) regions 21 are formed in substrate 20, and are used to define the active regions of MOS devices.

Dummy gate stack 22 is formed over substrate 20. Dummy gate stack 22 includes dummy gate dielectric 24 and dummy gate electrode 26. Dummy gate dielectric 24 includes silicon oxide in some exemplary embodiments. In alternative embodiments, other materials such as silicon nitride, silicon carbide, or the like, are also used. Dummy gate electrode 26 may include polysilicon. In some embodiments, dummy gate stacks 22 further includes hard mask 28 over dummy gate electrode 26. Hard mask 28 may comprise silicon nitride, for example, while other materials such as silicon carbide, silicon oxynitride, and the like may also be used. In alternative embodiments, hard mask 28 is not formed.

Figure 10:
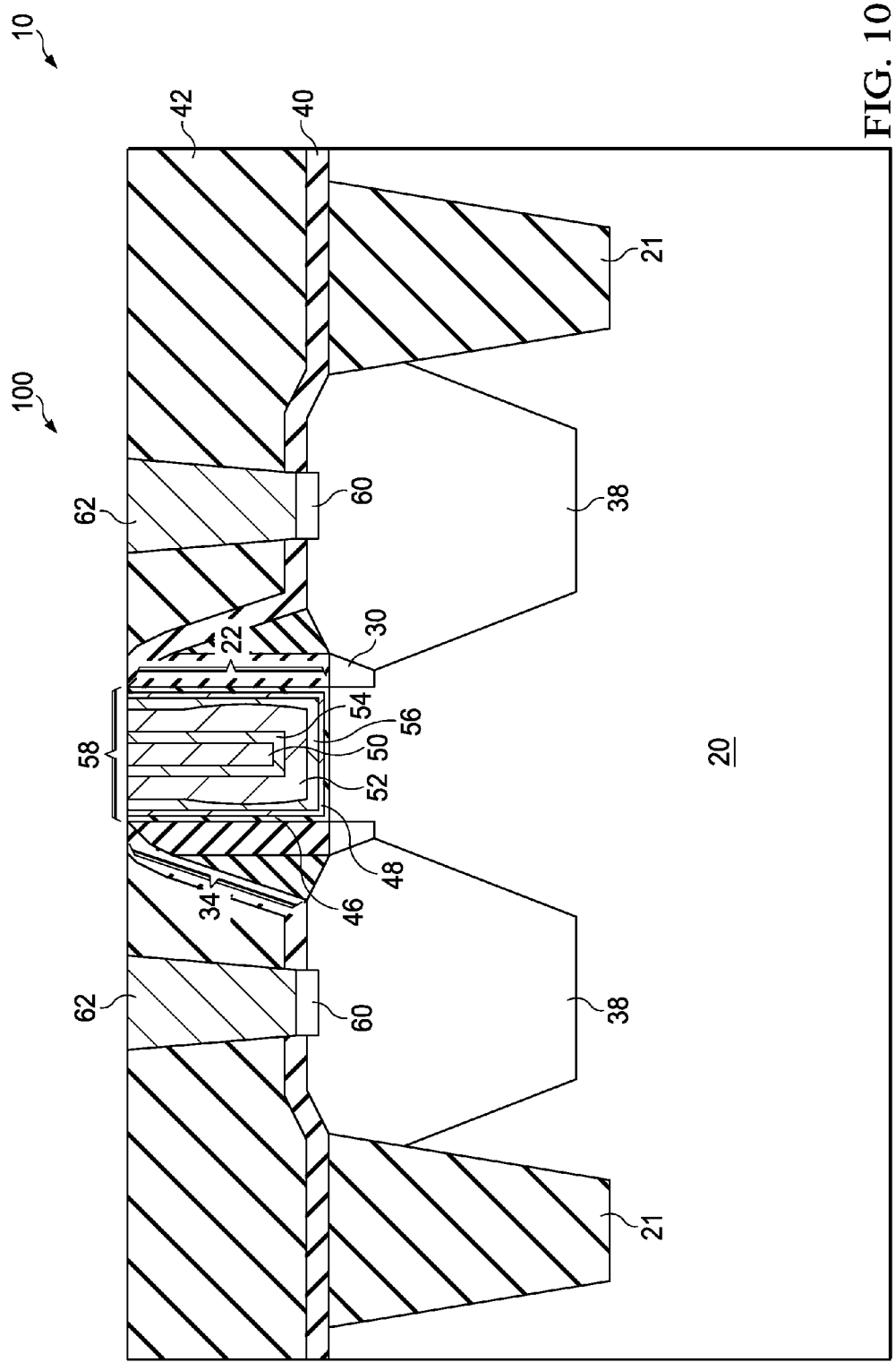

Lightly-Doped Drain/source (LDD) regions 30 are formed, for example, by implanting a p-type impurity (such as boron and/or indium) or an n-type impurity (such as phosphorous and/or arsenic) into substrate 20, depending on the conductivity type of the resulting MOS device 100 (FIG. 10). For example, when MOS device 100 is a pMOS device, LDD regions 30 are p-type regions. When the MOS device 100 is an nMOS device, LDD regions 30 are n-type regions. Dummy gate stacks 22 acts as an implantation mask, so that the edges of LDD regions 30 are substantially aligned with the edges of gate stacks 22.

Figure 2:
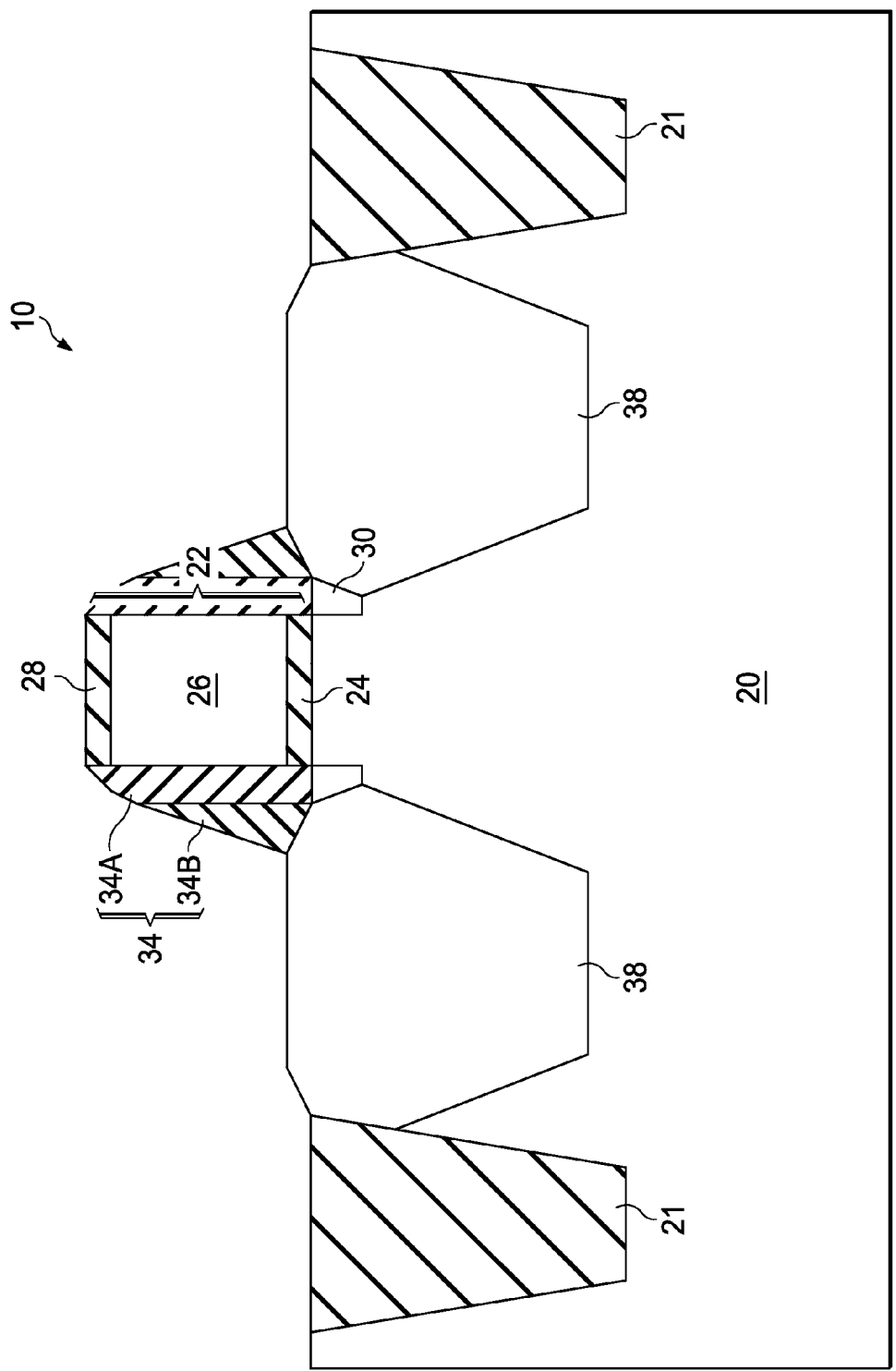

Referring to FIG. 2, gate spacers 34 are formed on the sidewalls of dummy gate stack 22. In some embodiments, each of gate spacers 34 includes silicon oxynitride layer 34A and silicon oxide layer 34B. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

Source and drain regions (referred to as source/drain regions hereinafter) 38 are formed in semiconductor substrate 20. In the embodiments wherein MOS device 100 (FIG. 10) is a pMOS device, source/drain regions 38 are of p-type. In the embodiments wherein MOS device 100 is an nMOS device, source/drain regions 38 are of n-type. In some embodiments, source/drain stressors (also marked as 38) are formed in semiconductor substrate 20. The source/drain stressors form at least parts of source and drain regions 38. FIG. 2 illustrates the embodiments in which source/drain regions 38 fully overlap the respective source/drain stressors. In alternative embodiments, source/drain regions 38 and the source/drain stressors are partially overlapped.

Furthermore, in the embodiments in which MOS device 100 (FIG. 10) is an nMOS device, source/drain stressors 38 may comprise silicon phosphorous (SiP), silicon carbon (SiC), or the like. In the embodiments in which MOS device 100 is a pMOS device, source/drain stressors 38 may comprise silicon germanium (SiGe). The formation of source/drain stressors 38 may be achieved by etching semiconductor substrate 20 to form recesses therein, and then performing an epitaxy to grow source/drain stressors 38 in the recesses.

Figure 3:
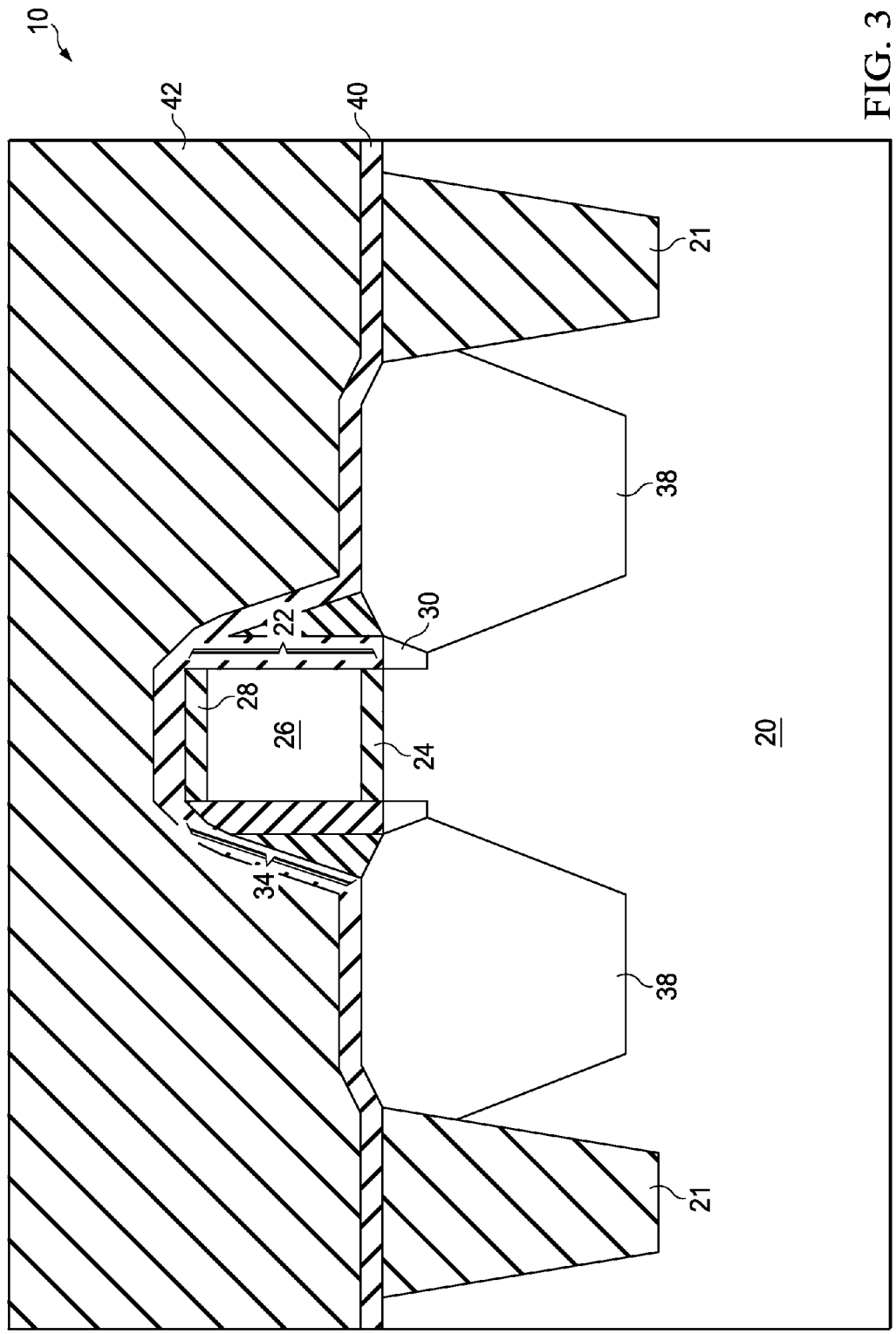

Referring to FIG. 3, Contact Etch Stop Layer (CESL) 40 is formed over gate stack 22 and source/drain regions 38. In some embodiments, CESL 40 comprises silicon nitride, silicon carbide, or other dielectric materials. Inter-Layer Dielectric (ILD) 42 is form over CESL 40. ILD 42 is blanket formed to a height higher than the top surface of dummy gate stack 22. ILD 42 may comprise Flowable oxide formed using, for example, Flowable Chemical Vapor Deposition (FCVD). ILD 42 may also be a spin-on glass formed using spin-on coating. For example, ILD 42 may comprise Phospho-Silicate Glass (PSG), Boro-Silicate Glass (BSG), Boron-Doped Phospho-Silicate Glass (BPSG), Tetraethyl Orthosilicate (TEOS) oxide, TiN, SiOC, or other low-k non-porous dielectric materials.

Figure 4:
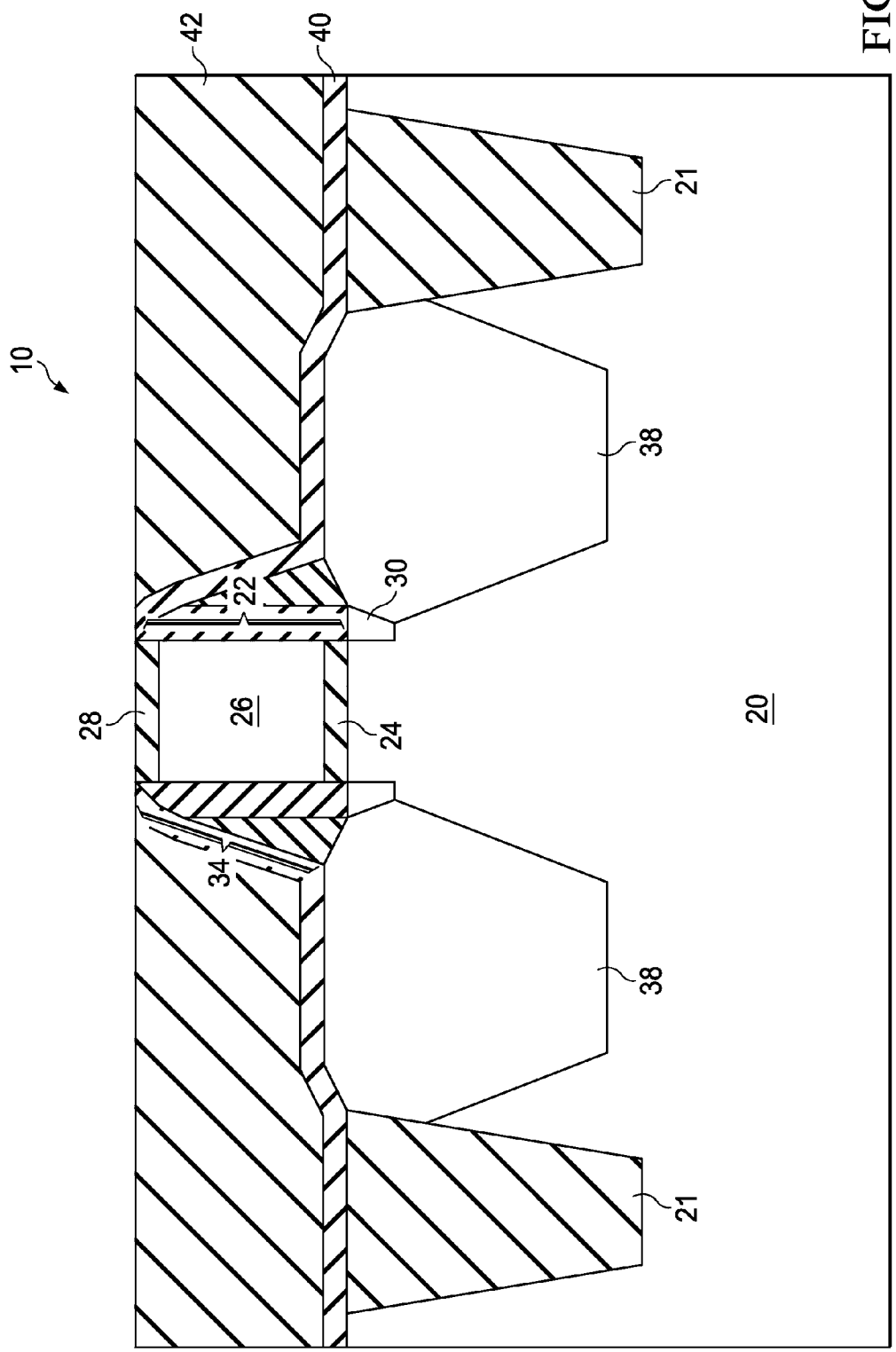

FIG. 4 illustrates a planarization step, which is performed using, for example, Chemical Mechanical Polish (CMP). The CMP is performed to remove excess portions of ILD 42 and CESL 40, wherein the excess portions are over the top surface of hard mask 28. Accordingly, dummy gate stack 22 is exposed. In alternative embodiments, hard mask 28 is removed during the CMP, wherein the CMP stops on the top surface of dummy gate electrode 26.

Figure 5:
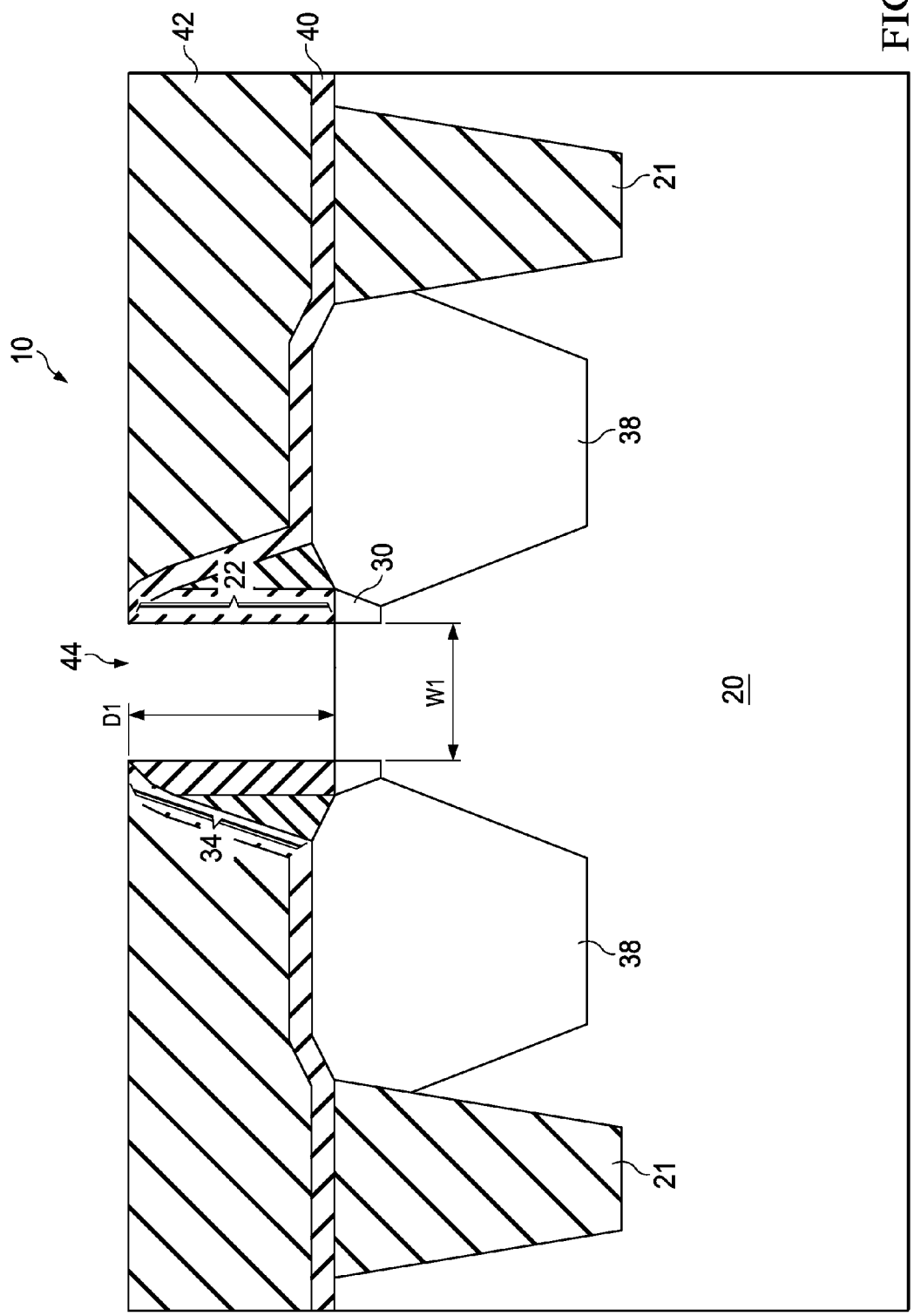

Next, dummy gate stack 22 is removed. Recess 44 is formed as a result of the removal of dummy gate stack 22, wherein the resulting structure is shown in FIG. 5. In some embodiment, the width W1 of recess 44 is smaller than about 25 nm, and may be in the range between about 18 nm and about 22 nm. It is appreciated, however, that the values recited throughout the description are merely examples, and may be changed to different values. Furthermore, depth D1 of recess 44 may be greater than about 40 nm. The aspect ratio D1/W1 of recess 44 may be higher than about 1.3, and may be higher than about 7.0, or higher than about 10. Such high aspect ratio, small width W1, and great depth D1 demand the subsequently formed metal layers to be conformal in order to achieve the required performance.

Figure 6:
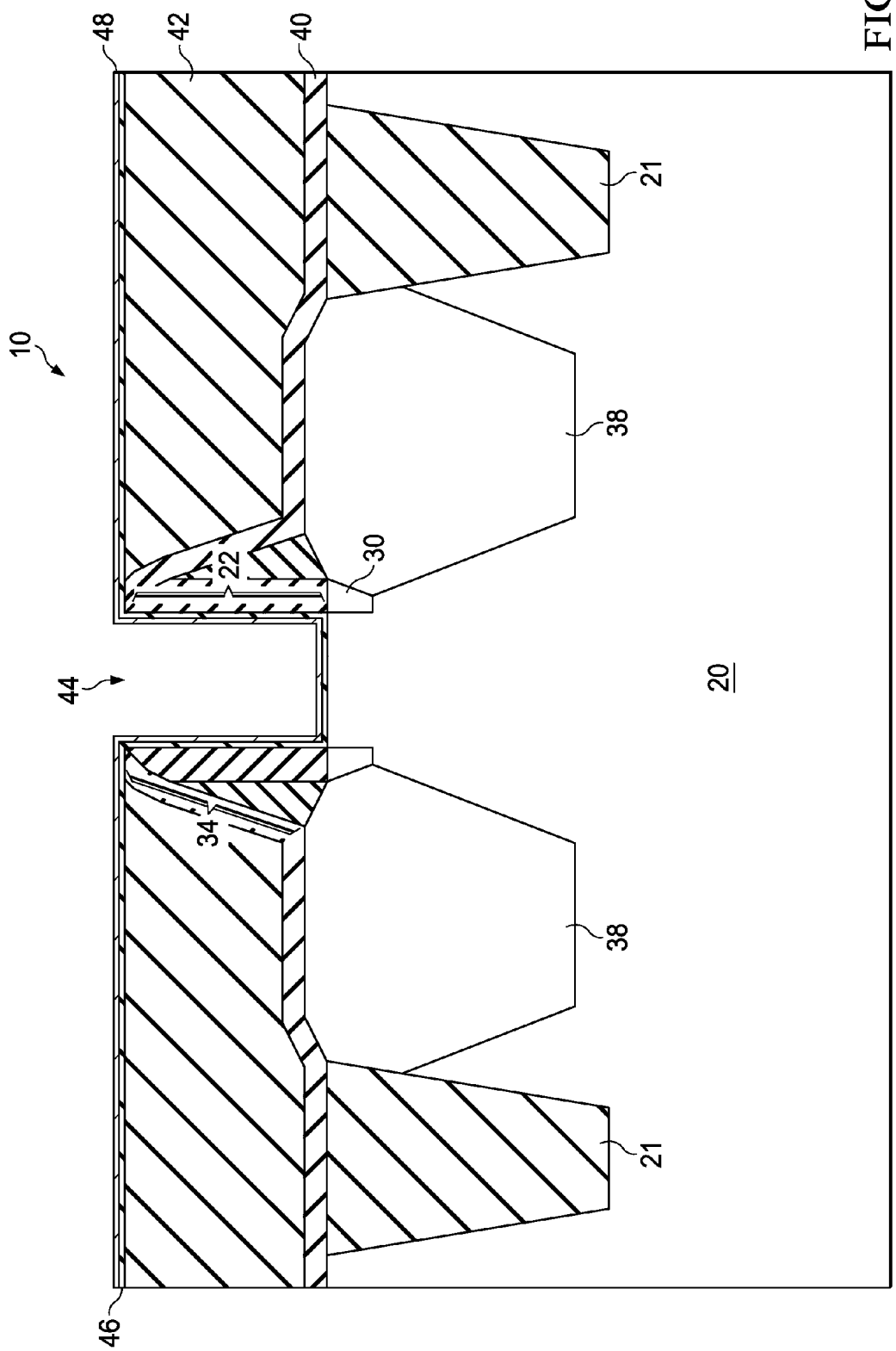

FIGS. 6 through 9 illustrate the formation of a replacement gate stack. Referring to FIG. 6, gate dielectric layer 46 is formed. In some embodiments, gate dielectric layer 46 includes an Interfacial Layer (IL, the lower part of gate dielectric layer 46), which is a dielectric layer. In some embodiments, the IL layer includes an oxide layer such as a silicon oxide layer, which may be formed through the thermal oxidation of substrate 20, a chemical oxidation, or a deposition step. Gate dielectric layer 46 may also include a high-k dielectric layer (the upper part of gate dielectric layer 46) comprising a high-k dielectric material such as hafnium oxide, lanthanum oxide, aluminum oxide, or the like. The dielectric constant (k-value) of the high-k dielectric material is higher than 3.9, and may be higher than about 7.0, and sometimes as high as 21.0 or higher. The high-k dielectric layer is overlying, and may contact, the interfacial dielectric.

As shown in FIG. 6, diffusion barrier layer 48 is formed over gate dielectric layer 46. In some embodiments, diffusion barrier layer 48 includes TiN, TaN, or composite layers thereof. For example, diffusion barrier layer 48 may include a TiN layer (the lower part of diffusion barrier layer 48), and a TaN layer (the upper part of diffusion barrier layer 48) over the TiN layer. The TiN layer may have a thickness lower than about 65 Å, and the TaN layer may have a thickness lower than about 20 Å.

Figure 7:
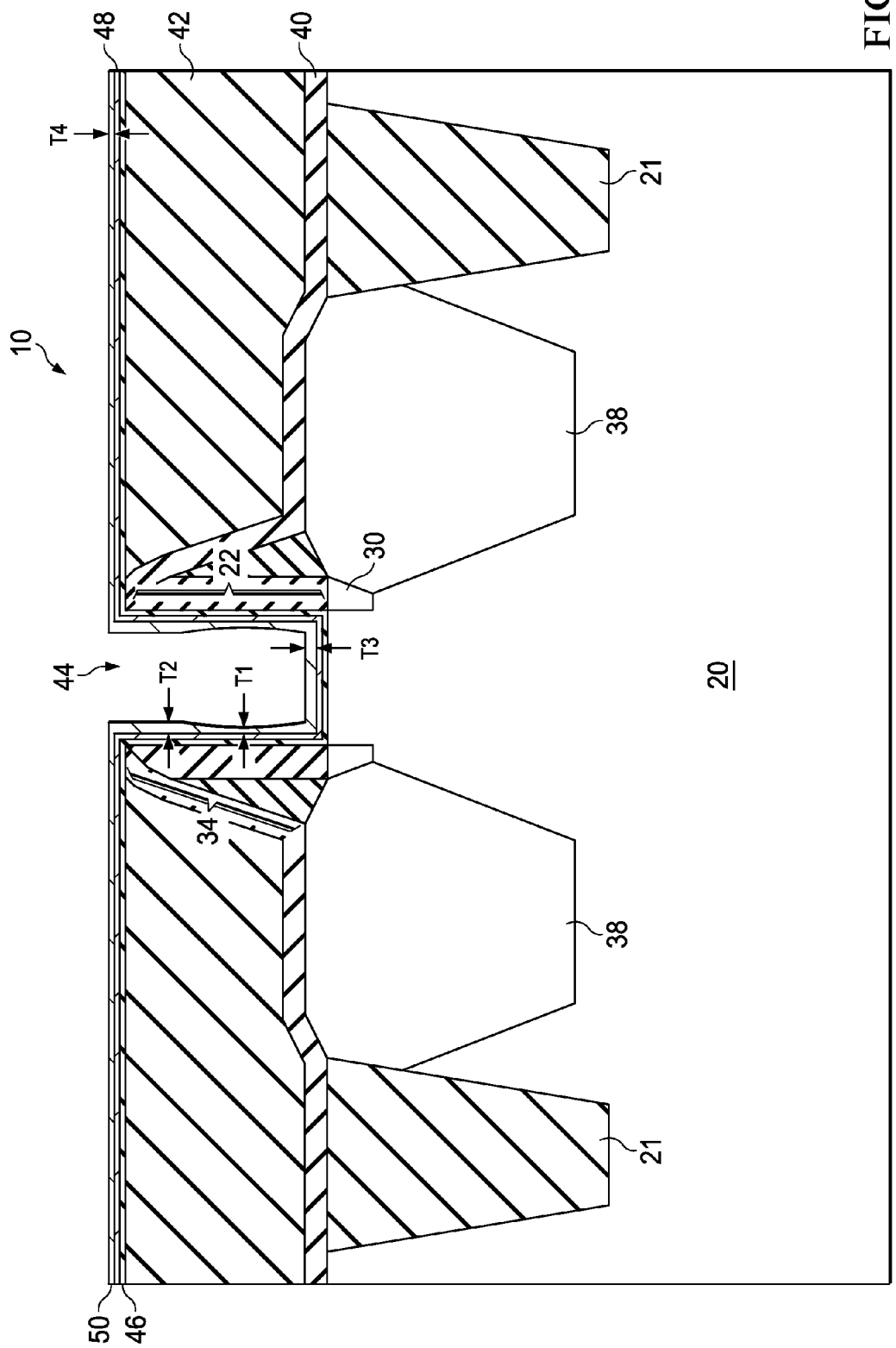

Referring to FIG. 7, metal layer 50 is formed. Metal layer 50 may comprise titanium aluminum (TiAl) in accordance with some embodiments. In the embodiments in which the resulting MOS device 100 (FIG. 10) is an N-type MOS (NMOS) device, metal layer 50 is in contact with diffusion barrier layer 48. For example, in the embodiments in which diffusion barrier layer 48 comprises a TiN layer and a TaN layer, metal layer 50 may be in physical contact with the TaN layer. In alternative embodiments in which the resulting MOS device 100 (FIG. 10) is a P-type MOS (PMOS) device, an additional TiN layer (not shown) is formed between, and in contact with, the TaN layer (in diffusion barrier layer 48) and the overlaying metal layer 50. The additional TiN layer provides the work function suitable for PMOS devices, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

Metal layer 50 provides the work function suitable for NMOS devices, which work function is lower than the mid-gap work function. The work function lower than the mid-gap work function is referred to as an n-work function, and the respective metal having the n-work function is referred to as an n-metal. In some embodiments, metal layer 50 is an n-metal having a work function lower than about 4.3 eV. The work function of metal layer 50 may also be in the range between about 3.8 eV and about 4.6 eV.

Figure 11:
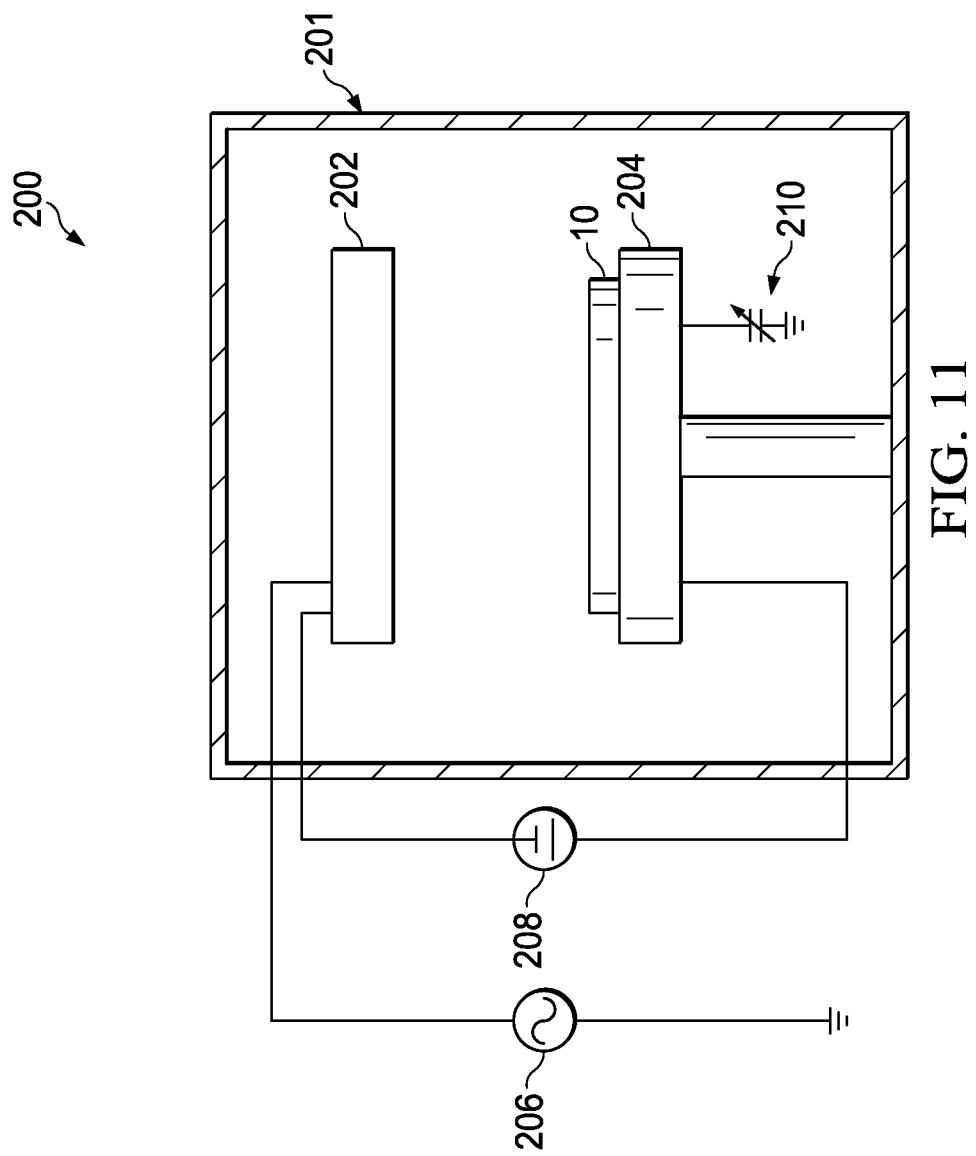
FIG. 11 illustrates a cross-sectional view of a production tool for forming a metal layer in a replacement gate of a MOS device in accordance with some embodiments.

The formation of metal layer 50 may be achieved through Physical Vapor Deposition (PVD). FIG. 11 illustrates an exemplary production tool 200 for forming metal layer 50. Wafer 10 is placed in vacuum chamber 201, which is vacuumed during the deposition of metal layer 50. Target 202, which comprises TiAl or other materials for forming metal layer 50 in FIG. 7, is placed over wafer 10. Wafer 10 is further placed on pedestal 204, which may be an electrostatic chuck in some embodiments.

In accordance with some embodiments, production tool 200 includes both Radio Frequency (RF) power source 206 for providing RF power and DC power source 208 for providing a DC power. The RF power source 206 may provide RF power with a frequency in the range between about 10 GHz and about 30 GHz. RF power source 206 has a first end electrically coupled/connected to target 202 (for example, through a matching network (not shown), and a second end electrically grounded. The DC power source 208 may have its negative end electrically coupled/connected to target 202, and it positive end electrically coupled/connected to pedestal 204. In addition, pedestal 204 may be electrically coupled/connected to electrical ground, for example, through capacitor

220. The capacitance of capacitor 210 may be adjusted in order to adjust the impedance of production tool 200.

In accordance with some embodiments, during the deposition of metal layer 50 (FIG. 7), the DC power and the RF power are applied simultaneously, both having the effect of sputtering TiAl from target 202 and to deposit on wafer 10 to form metal layer 50 as in FIG. 7. The DC power provided by DC power source 208 may be in the range between about 500 Watts and about 3 kilowatts. The RF power affects the quality of metal layer 50, and hence the RF power needs to be in certain range. For example, when the RF power is increased, the ratio of T3/T4 becomes smaller (and worse), wherein thickness T3 is the thickness of the horizontal portion of metal layer 50 at the bottom of recess 44, and thickness T4 is the thickness of the horizontal portions of metal layer 50 outside of recess 44.

The conformity of the sidewall thickness (such as thickness T1) is improved due to the increase in RF power. On the other hand, reducing the RF power results in the improvement (the increase) in ratio T3/T4 and the undesirable reduction in thickness T1 (and the conformity). In some exemplary embodiments, the RF power provided by RF power source 206 is greater than about 1 kilowatt, and may be in the range between about 1 kilowatts and about 5 kilowatts. As a result of the RF power and the DC power, wafer 10 may have an induced negative wafer bias. In some exemplary embodiments, the induced negative wafer bias is in the range between about −50 volts and about −170 volts, wherein in this range, the resulting metal layer 50 has a satisfactory T3/T4 ratio and a satisfactory conformity.

As a result of both the RF power and the DC power used for the PVD of metal layer 50, metal layer 50 is more conformal than the metal layer formed in conventional processes, in which DC power is used, and no RF power is provided. For example, referring to FIG. 7, metal layer 50 may have a thinnest portion in recess 44, which thinnest portion is at the lower part of the sidewall portion of metal layer 50. In some embodiments, thickness T1 (referred to as the minimum thickness hereinafter) of the thinnest portion of metal layer 50 is greater than about 1 nm. On the other hand, thickness T2 measured at the top of recess 44 may be smaller than about 2 nm. Accordingly, by providing the RF power and the DC power simultaneously in the formation of metal layer 50, metal layer 50 is more conformal than the metal layer formed without the RF power. The overhang of metal layer 50 is also reduced. This is advantageous for the gap filling (for fill recess 44) in advanced technologies, for example, when width W1 (FIG. 5) is about 20 nm or smaller. In order for the work function of the TiAl to take effect, the thickness of metal layer 50 needs to have certain thickness, for example, greater than about 1 nm. This means that the thinnest part must also be thicker than 1 nm. As a result, other parts of metal layer may be much thicker, and the overhang is severe. Since the width W1 is very small, for example, about 20 nm or smaller, this may result in a large void to be sealed by the resulting replacement gate, and the performance of the resulting MOS device is adversely affected. In the embodiments of the present disclosure, the thinnest parts of metal layer 50 satisfy the minimum thickness requirement while other parts of metal layer 50 are not too thick.

Figure 8:
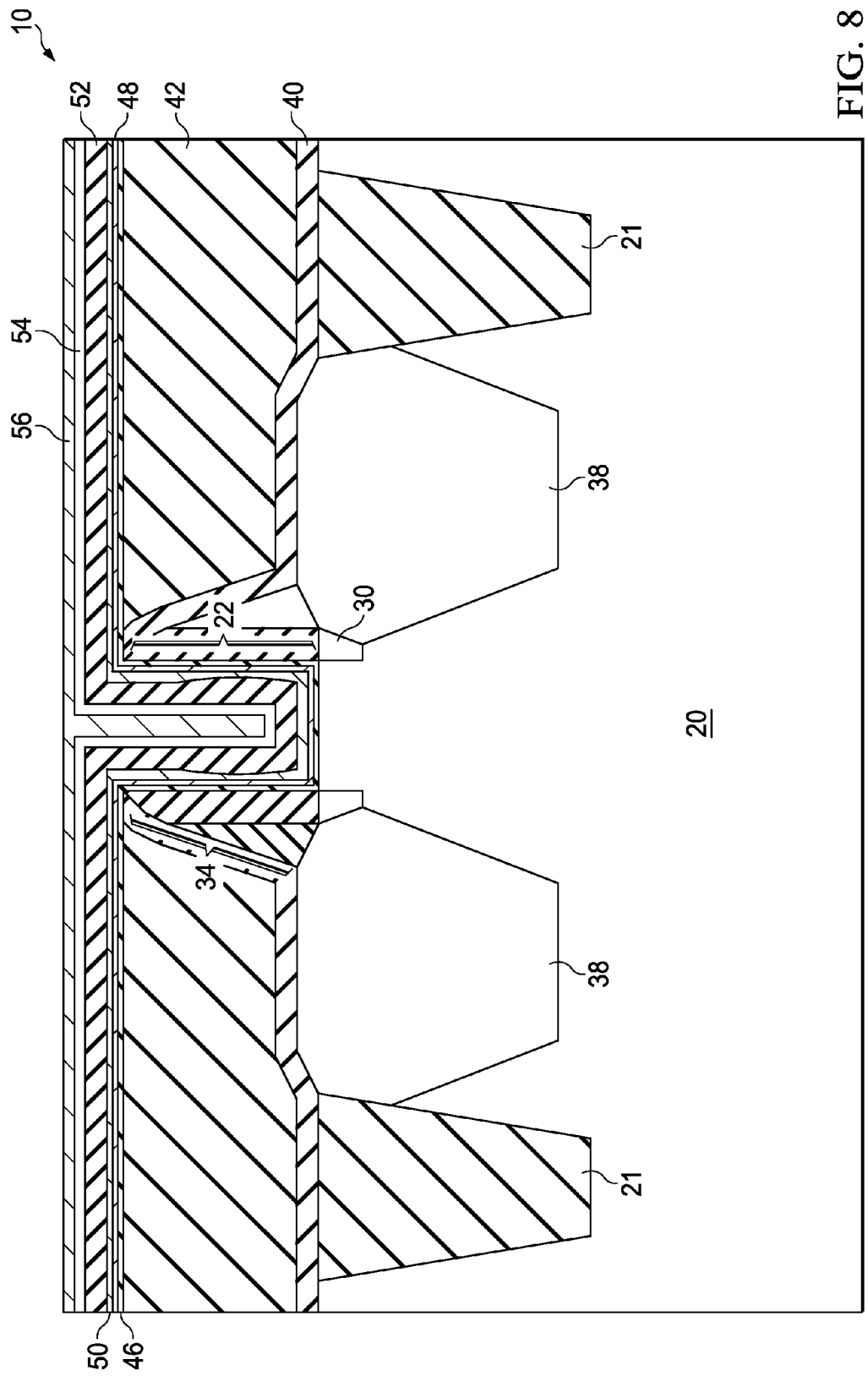

Next, more layers are formed to fill recess 44, and the resulting structure is shown in FIG. 8. In some exemplary embodiments, the subsequently formed metal layers include block layer 52, wetting layer 54, and filling metal 56. Block layer 52 may comprise TiN in some embodiments, which may be formed using PVD. Wetting layer 54 may be a cobalt layer, which may be formed using Chemical Vapor Deposition (CVD). Filling metal 56 may comprise aluminum or an aluminum alloy, which may also be formed using PVD, CVD, or the like. Filling metal 56 may be reflowed to fully fill the remaining recess 44 as in FIG. 7.

Figure 9:
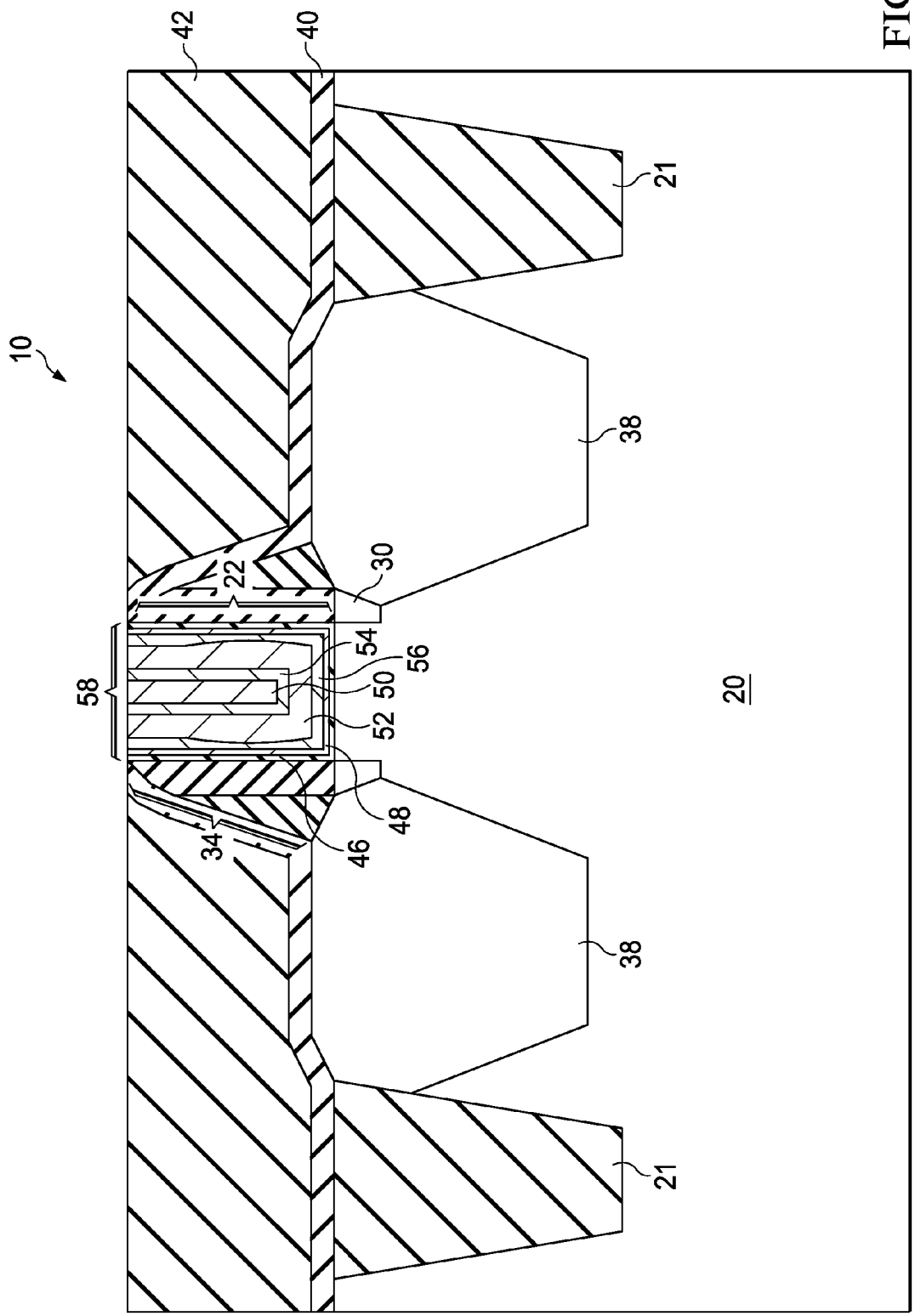

FIG. 9 illustrates a planarization step (for example, a CMP) for removing excess portions of layers 46, 48, 50, 52, 54, and 56, wherein the excess portions are over ILD 42. The remaining portions of layers 46, 48, 50, 52, 54, and 56 form replacement gate stack 58. Each of the remaining portions of layers 46, 48, 50, 52, 54, and 56 includes a bottom portion, and sidewall portions over and connected to the bottom portion.

Referring to FIG. 10, source/drain silicide regions 60 and contact plugs 62 are formed. The formation process may include forming contact plug openings in ILD 42 to expose source/drain regions 38, forming a metal layer (not shown) to extend into the contact plug openings, performing an annealing to form the source/drain silicide regions 60, removing the un-reacted portions of the metal layer, and filling the contact plug openings to form contact plugs 62. MOS device 100 is thus formed.

The embodiments of the present disclosure have some advantageous features. By applying the RF and the DC power simultaneously, the conformity of the metal layers (such as TiAl layers) in the replacement gates of the MOS devices is improved. Hence, the TiAl layer, which provides the work function for NMOS devices, may have required thickness, even at the locations where the TiAl layer is the thinnest. Hence, the performance of the MOS devices is improved. Furthermore, the improvement in the conformity also means that the gap-filling process for forming the replacement gates is not adversely affected. For example, no void is adversely formed in the replacement gates due to the increase of the minimum thickness of the metal layer.

In accordance with some embodiments of the present disclosure, a method includes forming a dummy gate stack over a semiconductor substrate, wherein the semiconductor substrate is comprised in a wafer. The method further includes removing the dummy gate stack to form a recess, forming a gate dielectric layer in the recess, and forming a metal layer in the recess using PVD. The metal layer is over the gate dielectric layer. The formation of the metal layer includes placing the wafer against a target, applying a DC power to the target, and applying an RF power to the target, wherein the DC power and the RF power are applied simultaneously. A remaining portion of the recess is then filled with metallic materials, wherein the metallic materials are overlying the metal layer.

In accordance with alternative embodiments of the present disclosure, a method includes forming a dummy gate stack over a semiconductor substrate, wherein the semiconductor substrate is comprised in a wafer. The dummy gate stack is removed to form a recess in an inter-layer dielectric layer. A gate dielectric layer is formed in the recess. A titanium aluminum layer is formed in the recess using PVD, wherein the titanium aluminum layer is over the gate dielectric layer. The formation of the titanium aluminum layer includes applying a DC power to a TiAl target, with aluminum and titanium in the TiAl target being deposited on the wafer, and simultaneously applying an RF power to the TiAl target to induce a wafer bias on the wafer, wherein the wafer bias is a negative bias. The remaining portions of the recess are filled with metallic materials, wherein the metallic materials are overlying the titanium aluminum layer.

In accordance with yet alternative embodiments of the present disclosure, an integrated circuit device includes a semiconductor substrate, an ILD layer over the semiconductor substrate, gate spacers in the ILD, and a replacement gate in the ILD and between opposite portions of the gate spacers, wherein a width of the replacement gate is smaller than about 20 nm. The replacement gate includes a gate dielectric layer, a diffusion barrier layer over the gate dielectric layer, and a titanium aluminum layer over the diffusion barrier layer. The titanium aluminum layer includes a sidewall portion on a sidewall of one of the gate spacers, wherein a thinnest portion of the sidewall portion of the titanium aluminum layer has a thickness greater than about 1 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy gate stack over a semiconductor substrate, wherein the semiconductor substrate is comprised in a wafer;
   removing the dummy gate stack to form a recess;
   forming a gate dielectric layer in the recess;
   forming a metal layer in the recess, wherein the metal layer is over the gate dielectric layer, and wherein the forming the metal layer comprises:
      placing the wafer against a target;
      applying a DC power to the target, wherein a negative end of the DC power is connected to the target, and a positive end of the DC power is connected to a pedestal underlying the wafer; and
      applying an RF power to the target, wherein the DC power and the RF power are applied simultaneously; and
   filling a remaining portion of the recess with metallic materials, wherein the metallic materials overlie the metal layer.

2. The method of claim 1, wherein the forming the metal layer in the recess is performed using Physical Vapor Deposition (PVD).

3. The method of claim 1, wherein the pedestal is coupled to electrical ground during the forming the metal layer.

4. The method of claim 1, wherein the forming the metal layer comprises depositing a titanium aluminum (TiAl) layer.

5. The method of claim 1, wherein the filling the remaining portion of the recess with the metallic materials comprises:
   depositing a titanium nitride layer over and contacting the metal layer;
   depositing a cobalt layer over and contacting the titanium nitride layer; and
   depositing an aluminum layer over the cobalt layer.

6. The method of claim 1 further comprising, after the forming the gate dielectric layer and before the forming the metal layer:
   forming a titanium nitride layer over the gate dielectric layer; and
   forming a tantalum nitride layer over the titanium nitride layer.

7. The method of claim 1 further comprising:
   performing a planarization to remove excess portions of the metallic materials, the metal layer, and the gate dielectric layer.

8. The method of claim 1, wherein the positive end of the DC power is directly connected to the pedestal without going through an electrical ground.

9. A method comprising:
   forming a dummy gate stack over a semiconductor substrate, wherein the semiconductor substrate is comprised in a wafer;
   removing the dummy gate stack to form a recess in an inter-layer dielectric layer;
   forming a gate dielectric layer in the recess;
   forming a titanium aluminum layer in the recess, wherein the titanium aluminum layer is over the gate dielectric layer, and wherein the forming the titanium aluminum layer comprises:
      applying a DC power to a TiAl target, with aluminum and titanium in the TiAl target being deposited on the wafer, wherein a negative end of the DC power is connected to the TiAl target, and a positive end of the DC power is directly connected to a pedestal underlying the wafer, with none of the TiAl target and the pedestal being directly grounded; and
      simultaneously applying an RF power to the TiAl target to induce a wafer bias on the wafer, with one end of the RF power being grounded, wherein the wafer bias is a negative bias; and
   filling remaining portions of the recess with metallic materials, wherein the metallic materials overlie the titanium aluminum layer.

10. The method of claim 9, wherein the forming the titanium aluminum layer in the recess is performed using Physical Vapor Deposition (PVD).

11. The method of claim 9, wherein the wafer bias is in a range between about −50 volts and about −170 volts, and wherein the RF power is higher than about 1 kilowatt.

12. The method of claim 9 further comprising:
   forming a contact etch stop layer overlying the dummy gate stack;
   forming the inter-layer dielectric over the contact etch stop layer; and
   performing a planarization to remove excess portions of the contact etch stop layer and the inter-layer dielectric, wherein the excess portions are over the dummy gate stack.

13. The method of claim 9, wherein the pedestal is coupled to electrical ground during the forming the titanium aluminum layer.

14. The method of claim 9, wherein the filling remaining portions of the recess with the metallic materials comprises:
   forming a titanium nitride layer over and contacting the titanium aluminum layer;
   forming a cobalt layer over and contacting the titanium nitride layer; and
   forming an aluminum layer over the cobalt layer.

15. The method of claim 9 further comprising, after the forming the gate dielectric layer and before the forming the titanium aluminum layer:
   forming a titanium nitride layer over the gate dielectric layer; and
   forming a tantalum nitride layer over the titanium nitride layer.

16. The method of claim 9 further comprising:
   performing a planarization to remove excess portions of the metallic materials, the titanium aluminum layer, and the gate dielectric layer.

17. A method comprising:
forming a dummy gate stack over a semiconductor substrate, wherein the semiconductor substrate is comprised in a wafer;
removing the dummy gate stack to form a recess;
forming a gate dielectric layer in the recess;
placing the wafer over a pedestal and under a target;
connecting a negative end of a DC power to the target, and a positive end of the DC power to the pedestal;
connecting an end of an RF power to the target; and
forming a metal layer over the gate dielectric layer by applying both the DC power and RF power.

18. The method of claim 17 further comprising adjusting a ratio of the DC power to the RF power to make a thinnest portion of the metal layer in the recess to be greater than about 1 nm, and a thickness of a portion of the metal layer that is measured at a top part of the recess to be greater than about 2 nm.

19. The method of claim 17, wherein the forming the metal layer is performed using physical vapor deposition.

20. The method of claim 17, wherein the metal layer comprises titanium aluminum.

\* \* \* \* \*